United States Patent
Jaeger et al.

(10) Patent No.: US 9,768,165 B2
(45) Date of Patent: Sep. 19, 2017

(54) HIGH ISOLATION SWITCH

(71) Applicant: Futurewei Technologies, Inc., Plano, TX (US)

(72) Inventors: Kent Jaeger, Cary, IL (US); Lawrence Connell, Naperville, IL (US)

(73) Assignee: FUTUREWEI TECHNOLOGIES, INC., Plano, TX (US)

( * ) Notice: Subject to any disclaimer, the term of this patent is extended or adjusted under 35 U.S.C. 154(b) by 0 days.

(21) Appl. No.: 15/256,154

(22) Filed: Sep. 2, 2016

(65) Prior Publication Data

US 2016/0372464 A1 Dec. 22, 2016

Related U.S. Application Data

(63) Continuation of application No. 14/730,018, filed on Jun. 3, 2015, now Pat. No. 9,449,969.

(51) Int. Cl.
| | |
|---|---|
| *H01L 29/76* | (2006.01) |
| *H01L 27/088* | (2006.01) |
| *H01L 23/522* | (2006.01) |
| *H01L 23/528* | (2006.01) |
| *H01L 29/06* | (2006.01) |

(52) U.S. Cl.
CPC .......... *H01L 27/088* (2013.01); *H01L 23/522* (2013.01); *H01L 23/528* (2013.01); *H01L 29/0649* (2013.01)

(58) Field of Classification Search
CPC . H01L 27/088; H01L 29/0649; H01L 23/528; H01L 23/522

USPC .......................................................... 257/368
See application file for complete search history.

(56) References Cited

U.S. PATENT DOCUMENTS

| | | | | |
|---|---|---|---|---|
| 5,497,023 A | * | 3/1996 | Nakazato | ............ H01L 27/0214 257/372 |
| 5,610,550 A | * | 3/1997 | Furutani | ............. H01L 27/0218 257/371 |
| 6,323,539 B1 | * | 11/2001 | Fujihira | .............. H01L 29/7811 257/354 |
| 8,188,544 B2 | | 5/2012 | Kumagai et al. | |
| 8,310,478 B2 | | 11/2012 | Kumagai et al. | |
| 8,330,530 B2 | * | 12/2012 | Homol | ...................... H03F 3/72 327/427 |
| 2006/0217078 A1 | | 9/2006 | Glass et al. | |
| 2009/0146724 A1 | | 6/2009 | Mun et al. | |
| 2014/0011463 A1 | | 1/2014 | Madan et al. | |

FOREIGN PATENT DOCUMENTS

| | | |
|---|---|---|
| CN | 104639135 A | 5/2015 |
| EP | 2871775 A1 | 5/2015 |

\* cited by examiner

*Primary Examiner* — Luan C Thai
(74) *Attorney, Agent, or Firm* — Slater Matsil, LLP

(57) ABSTRACT

An embodiment integrated circuit includes a switch and a conductive line over the switch. The switch includes a gate, a first source/drain region at a top surface of a semiconductor substrate, and a second source/drain region at the top surface of the semiconductor substrate. The first source/drain region and the second source/drain region are disposed on opposing sides of the gate. At least a portion of the first conductive line is aligned with the gate, and the first conductive line is electrically coupled to ground.

20 Claims, 5 Drawing Sheets

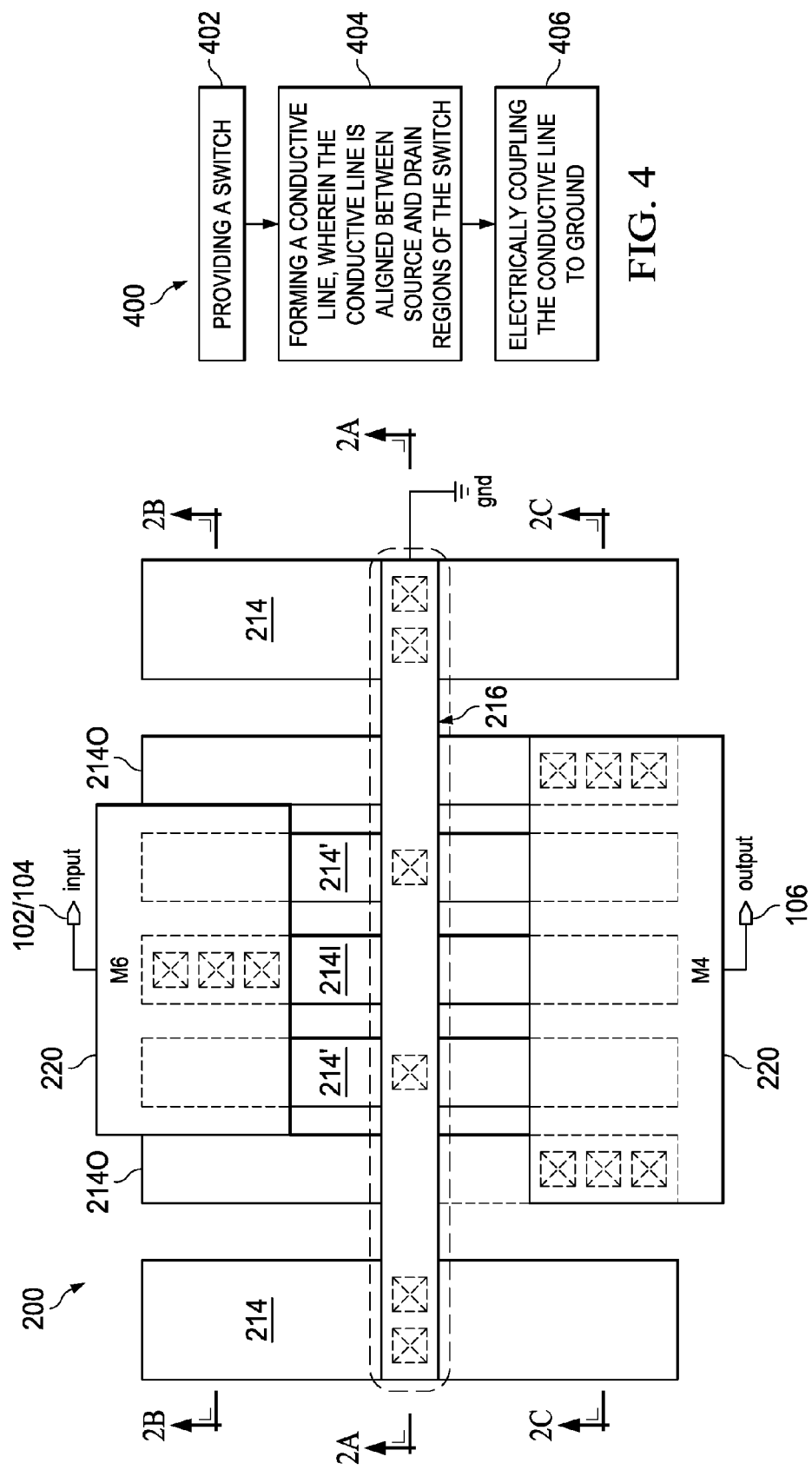

HIGH ISOLATION SWITCH

CROSS-REFERENCE TO RELATED APPLICATIONS

This application is a continuation application of U.S. application Ser. No. 14/730,018, filed on Jun. 3, 2015, which application is hereby incorporated herein by reference.

TECHNICAL FIELD

The present invention relates generally to a device and method for integrated circuit components, and, in particular embodiments, to a device and method for a high isolation switch.

BACKGROUND

In typical networking devices, various switches are used in integrated circuits to support different functionalities. For example, a cellular transceiver may support carrier aggregation, which allows for the simultaneous reception of two independent frequency channels. In order to provide simultaneous reception, at least two receive mixers, each driven by an independent frequency divider, are used. These frequency dividers are driven or clocked by one of two different voltage-controlled oscillators (VCOs) that run concurrently. Each divider clock input is also selectable between the two VCOs, and a two-to-one input switch network is often used.

In these types of circuits, the VCOs generally run simultaneously at different frequencies. Therefore, a high degree of isolation between switches is desirable to reduce energy coupling through a disabled switch. For example, when energy passes through a disabled switch, a spur could occur on the input to the frequency dividers. The spur may propagate through the frequency dividers and onto the receive mixer, resulting in unwanted signals mixed into the desired band. By providing isolation between the input switches, energy passing through a disabled switch is reduced.

A multiple switch circuit may be used to provide high isolation. For example, good isolation can be achieved by using two switches in series with a ground shunt switch placed between them. However, this type of scheme requires the two series pass switches to be at least two times larger to provide a comparable resistance of a single switch circuit. Consequently, the total parasitic capacitance of these two series switches in combination with the shunt switch is about four times larger than the capacitance associated with a single switch. This not only limits the operating frequency range of these switches, but also increases power consumption.

SUMMARY

In accordance with an embodiment of the present invention, an integrated circuit includes a switch and a conductive line over the switch. The switch includes a gate, a first source/drain region at a top surface of a semiconductor substrate, and a second source/drain region at the top surface of the semiconductor substrate. The first source/drain region and the second source/drain region are disposed on opposing sides of the gate. At least a portion of the first conductive line is aligned with the gate, and the first conductive line is electrically coupled to ground.

In accordance with another embodiment, an integrated circuit structure a first source/drain region at a top surface of a semiconductor substrate, a second source/drain region adjacent to the first source/drain region and disposed at the top surface of the semiconductor substrate, and a grounded conductive line disposed above the first and second source/drain regions. At least a portion of the grounded conductive line is aligned between the first source/drain region and the second source/drain region. The integrated circuit structure further includes a first conductive line over and electrically connected to the first source/drain region, first interconnect features electrically connecting the first conductive line to an input line disposed above the first conductive line, a second conductive line over and electrically connected to the second source/drain region, and second interconnect features electrically connecting the second conductive line to an output line disposed above the second conductive line.

In accordance with yet another embodiment, a method includes providing a switch having a gate, a first source/ region, and a second source/drain region. The first source/drain region and the second source/drain region are disposed on opposing sides of the gate. The method further includes forming a conductive line over the switch and electrically coupling the conductive line to ground. At least a portion of the conductive line is aligned between the source and the drain regions.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 illustrates a top-down view of metal layers of the integrated circuit device in accordance with some embodiments; and FIG. 4 illustrates an example process flow for forming an integrated circuit device in accordance with some embodiments.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Various embodiments are described within a specific context, namely a two-to-one input switch network. However, various embodiment devices may be used in any integrated circuit, particularly where active devices (e.g., switches) having improved isolation are desirable.

Figure 1A:
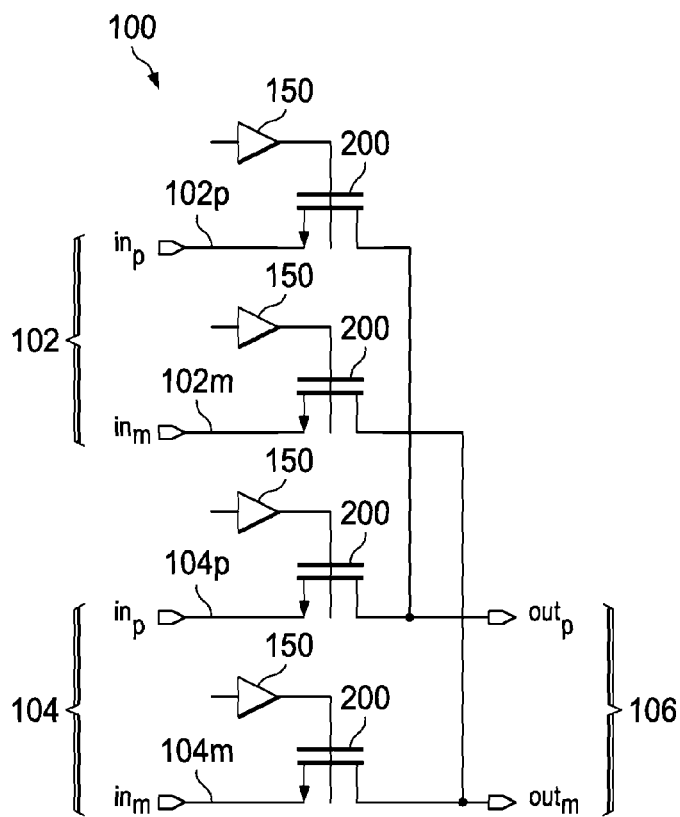
FIGS. 1A and 1B are circuit topologies of a two-to-one input switch network in accordance with some embodiments.
Figure 1B:
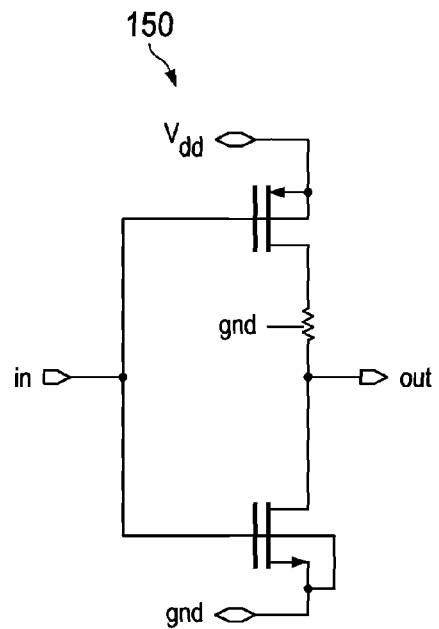

FIGS. 1A and 1B illustrate an example circuit 100 of a two-to-one input switch network in accordance with some embodiments. Circuit 100 receives two input signals 102 and 104, which are provided as differential signals 102$p$/102$m$ and 104$p$/104$m$, respectively. Each of the differential input signals 102$p$/102$m$/104$p$/104$m$ is connected to a source of a corresponding switch 200. In another embodiment, the input signals may be connected to drains of each switch 200. In the illustrated embodiments, switches 200 are n-type metal-oxide-semiconductor field-effect transistors (MOSFETs), although other types of active devices, such as p-type transistors, may also be used in other embodiments. Drains of each respective switch 200 provide an output signal 106, which is also a differential signal. In another embodiment, the input and/or output signals may be non-differential signals. In another embodiment, the output signal may be provided by sources of each of switch 200. Gates of each switch 200 are connected to a respective switch controller iso, which selects one of the two input signals as an output by enabling or disabling each switch 200 (e.g., selecting an "on" or "off" state of each switch). A respective switch controller 150 independently drives each switch 200 although other controller schemes may also be used. An example circuit topology for a suitable switch controller 150 is provided in FIG. 1B although other controller configurations may also be used.

Each switch 200 in circuit topology 100 provides relatively high isolation through embodiment layout techniques within switches 200 as described in greater detail below. Thus, additional isolation devices (e.g., additional switches) need not be included in the circuit topology and layout. For example, each differential input signal is connected to a single switch 200 as opposed to a multi-switch circuit. By reducing the number of active devices (switches) in the circuit, the overall capacitance and power consumption of circuit topology 100 is reduced while still maintaining high isolation. Given the large number of switches in a device application (e.g., in an oscillator distribution path of a cellar handset), even minute power savings may provide significant advantages.

Figure 2A:
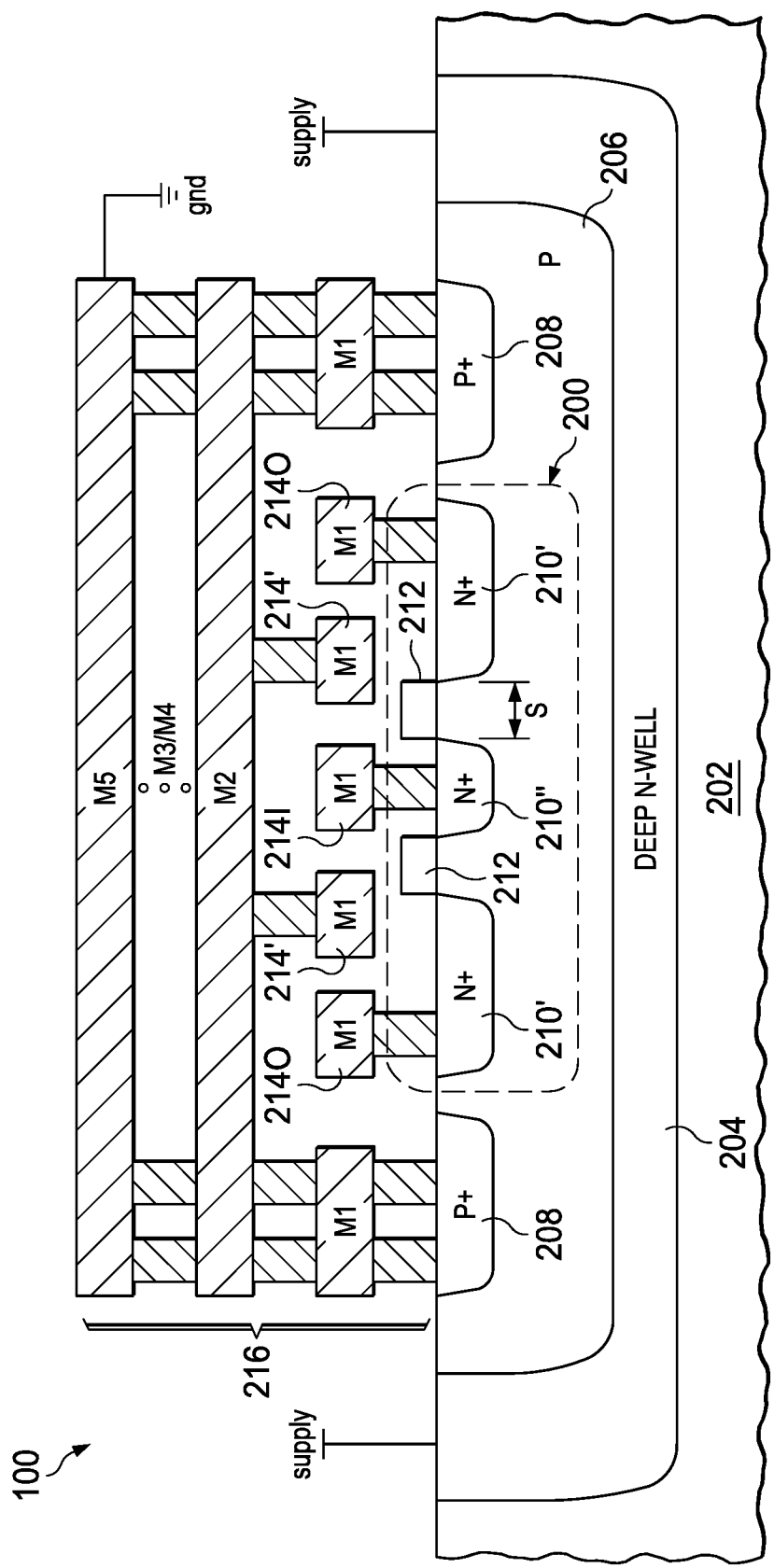
FIGS. 2A, 2B, and 2C illustrate varying cross-sectional views of an integrated circuit device in accordance with some embodiments.
Figure 2B:
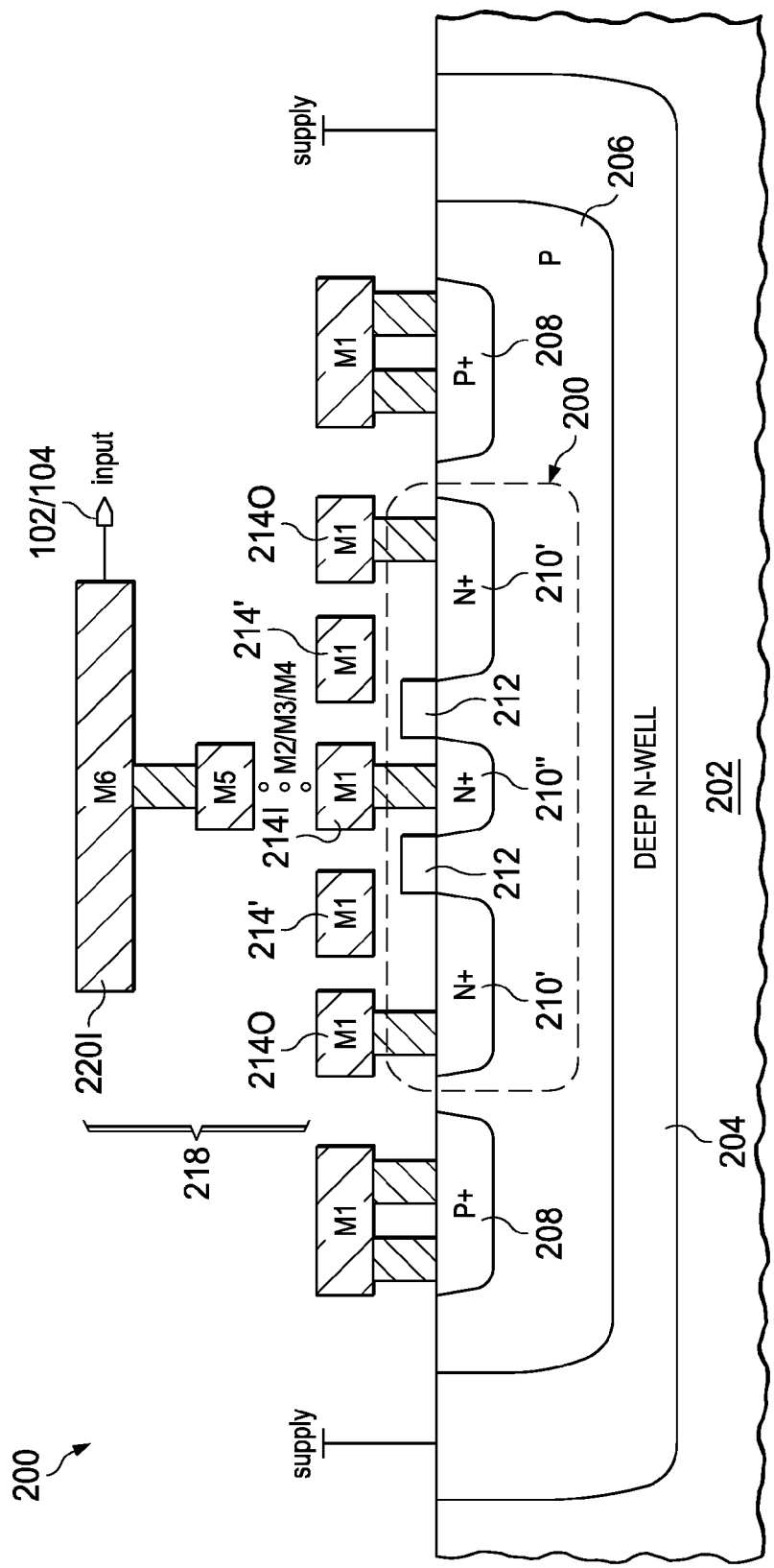
Figure 2C:
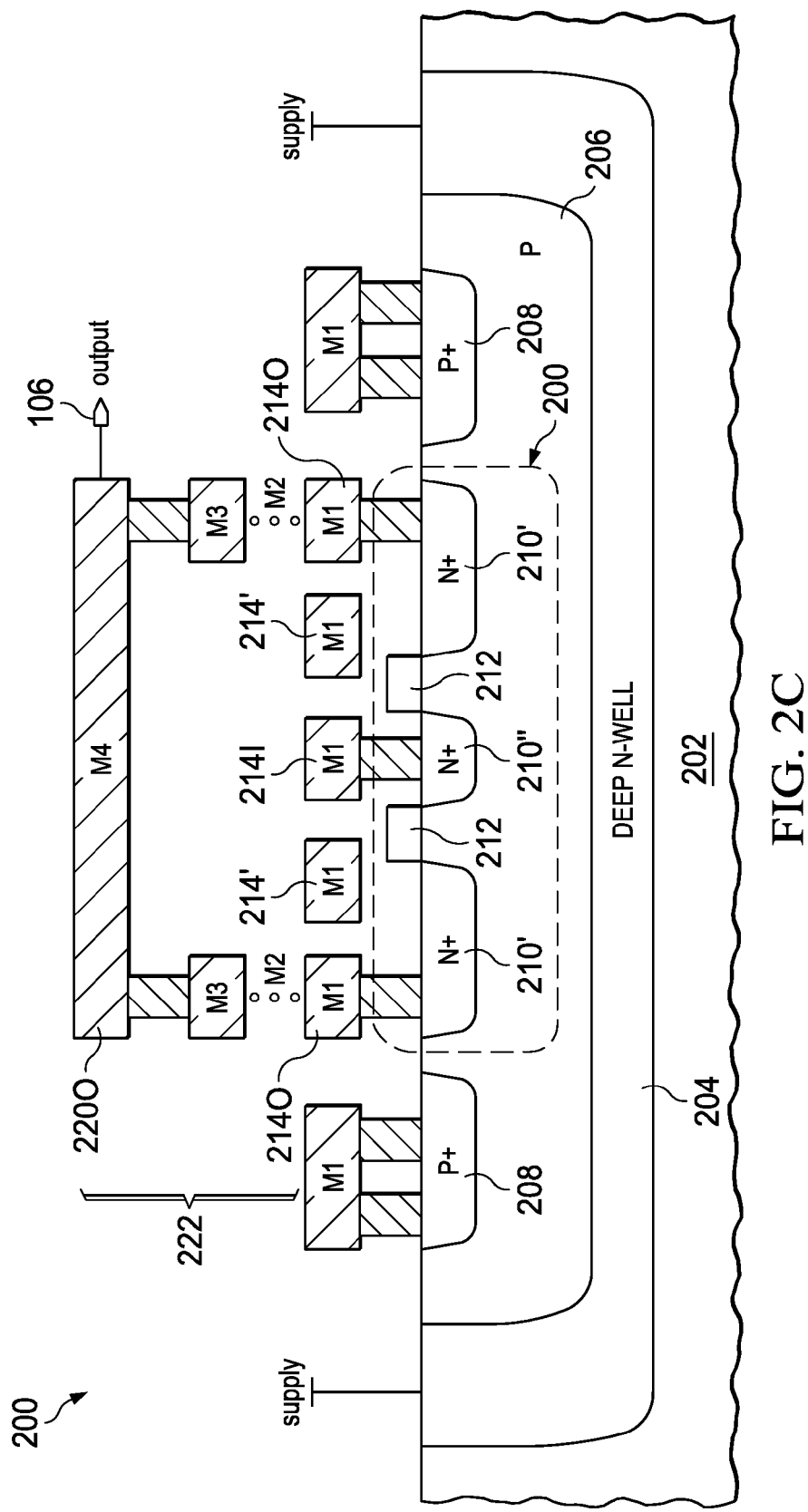

FIGS. 2A through 2C and 3 illustrate varying layout views of a switch 200 in circuit 100 according to some embodiments. FIGS. 2A through 2C illustrate cross-sectional views of switch 200 while FIG. 3 illustrates a corresponding top-down view of conductive lines over switch 200. Specifically, FIG. 2A illustrates a cross-section taken across line A-A of FIG. 3, FIG. 2B illustrates a cross-section taken across line B-B of FIGS. 3, and 2C illustrates a cross-section taken across line C-C of FIG. 3. Switch 200 includes various isolation features provided by embodiment layout configurations as described in greater detail below.

Referring first to FIG. 2A, switch 200 is formed at a top surface of a semiconductor substrate 202. In some embodiments, semiconductor substrate includes, for example, bulk silicon. Alternatively, substrate 202 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Substrate 202 includes an isolation region 204 and an isolated dopant region 206. Isolation region 204 and isolated dopant region 206 may be doped with n-type and p-type dopants at any suitable concentration, and isolation region 204 and isolated dopant region 206 are doped with dopants of opposing types. For example, in the illustrated embodiments, isolation region 204 is a deep n-well (DNW) while dopant region 206 is a p-well for a p-type substrate. Switch 200 is disposed within dopant region 206. Isolation region 204 isolates dopant region 206 from stray energy in the surrounding substrate 202. For example, isolation region 204 is disposed under and encircles a perimeter of dopant region 206. In some embodiments, switch 200 is placed in the vicinity of numerous other active devices (e.g., other switches, transistors, diodes, and the like) also formed in substrate 202, and energy may leak from nearby devices into substrate 202. By placing switch 200 within isolated dopant region 206, the risk of energy in substrate 202 being coupled (e.g., capacitive coupling) to switch 200 is reduced. Furthermore, isolation region 204 is tied to power supply (e.g., by conductive lines and vias), which advantageously lowers isolation region 204's series resistance to supply.

Switch 200 includes source/drain regions 210 (labeled 210' and 210") and gates 212 disposed between adjacent source/drain regions 210. Each source/drain region 210 is disposed on opposing sides of a corresponding gate 212. Source/drain regions 210 may be active regions of substrate 202, which are doped with dopants of a suitable type and concentration (e.g., N+ in the illustrated embodiments for an NMOS transistor). Gates 212 may include a gate dielectric (e.g., a high-k dielectric layer), a gate electrode (e.g., polysilicon or a metal) over the gate dielectric, and various interfacial/spacer/hard mask layers as applicable. In FIG. 2A, switch 200 is configured as a dual-gate transistor (e.g., a two finger NMOS transistor) having two drain regions and one source region; however, any suitable transistor configuration (e.g., single gate transistors) may be used. Furthermore, although FIG. 2A illustrates switch 200 as an n-type transistor, a p-type transistor may also be used. In such embodiments, the dopant type of various active areas (e.g., isolation region 204, dopant region 206, source/drain regions, and dopant region 208) may be reversed.

Dopant regions 208, having dopants of an opposing type as source/drain regions 210 are disposed adjacent to outer source/drain regions 210' within isolated dopant region 206. For example, in the illustrated embodiments, source/drain regions 210 are N+ regions and dopant region 208 are P+ regions. A dopant concentration of dopant region 208 may be higher than surrounding dopant region 206. Dopant regions 208 are electrically coupled to ground (e.g., electrically connected by an interconnect structure 216 to ground). Thus, the interconnect structure is referred to as a grounded conductive wall 216 hereinafter. Grounded conductive wall 216 includes conductive lines and vias formed in various dielectric layers using any suitable method. For example, the dielectric layers may include low-k dielectric materials having k-values, for example, lower than about 4.0 or lower than about 2.0, formed by spinning, chemical vapor deposition (CVD), plasma-enhanced CVD (PECVD), and the like. After each dielectric layer is formed, a patterning process (e.g., a combination of photolithography and etching) may be used to pattern openings in the dielectric layers. Subsequently, such openings are filled with a conductive material (e.g., copper, aluminum, tungsten, combinations thereof, and the like) using any suitable method (e.g., electro-chemical plating, electroless plating, and the like) to form various conductive vias and conductive lines M1 through M5 as illustrated. Throughout the description M1 indicates a conductive line layer closest to substrate 202, M2 indicates a conductive line layer immediately above M1, M3 indicates a conductive layer immediately above M2, and so on.

Dopant regions 208 are included to collect energy injected into dopant region 206 by active regions of switch 200 (e.g., source/drain regions 210 and channel regions) when switch 200 is enabled or disabled. For example, when switch 200 is enabled (e.g., in an "on" state), dopant regions 208 are used to keep energy from escaping into the surrounding substrate 202. As another example, when switch 200 is disabled (e.g., in an "off" state), dopant regions 208 are used to lower the energy coupling between adjacent source/drain regions 210. Thus, dopant regions 208 may be used to reduce stray energy from accumulating in dopant region 206. Instead, dopant regions 208 collect and shunt this energy to electrical ground. In some embodiments, dopant regions 208 are disposed adjacent (e.g., as close as possible) to active source/drain regions 210 for improved energy collection. Dopant region 208 may also collect energy injected into dopant region 206 through the isolation region 204 from the surrounding substrate 202.

Gates 212 are electrically coupled to a control circuit (e.g., controller 150), which selects whether to pass an input signal to an output of switch 200 by turning switch 200 "on" or "off". A source/drain region 210" is electrically coupled to an input signal 102/104. For example, source/drain regions 210" are electrically connected to input signal 102/104 by conductive lines 214I as illustrated by FIGS. 2B and 3. Source/drain regions 210' are electrically coupled to an output signal 106. For example, source/drain regions 210' are electrically connected to output signal 106 by conductive lines 214O as illustrated by FIGS. 2C and 3. In another embodiment, the configuration of the input and output signals may be reversed depending on whether the input signal or the output signal benefits from less parasitic capacitance. For example, in another embodiment, the source/drain region 210" may be electrically connected to an output signal 106 by conductive line 214I (an M1 line) and 220I (an M6 line). In the illustrated embodiments, less parasitic capacitance is desired at the input, so the input of the switch is connected to a conductive line 214I and 220I.

In order to reduce electrical coupling between source/drain regions 210 when switch 200 is disabled (e.g., in an "off" state), grounded conductive lines 214' are disposed between adjacent conductive lines 214I and 214O. Grounded conductive lines 214' are electrically coupled to ground. For example, grounded conductive wall 216 may electrically connect conductive lines 214' to ground, and grounded conductive lines 214' may be used to pass coupled energy from source/drain regions 210 when switch 200 is disabled to ground. Grounded conductive lines 214' are aligned between adjacent source/drain regions 210 in semiconductor substrate 202. For example, at least a portion of each grounded conductive lines 214' is aligned with a gate 212. A geometric line substantially perpendicular with a lateral surface of the substrate may intersect both gate 212 and grounded conductive line 214'.

In some embodiments, an active area of switch 200 (e.g., the spacing and size of source/drain regions 210) may be increased to accommodate the placement of grounded conductive lines 214' above and aligned between source/drain regions 210. In some embodiments, gates 212 may further be positioned to reduce capacitance of the active area on the input rather than the output to further reduce power consumption. For example, as illustrated by the figures, outer source/drain regions 210' are configured to have a larger lateral dimension. This configuration also accommodates the placement of conductive lines 214' aligned between adjacent source/drain regions 210.

FIGS. 2B and 2C illustrate cross-sectional views of input/output lines 220. Specifically, input line 220I provides an input signal 102/104 to conductive line 214I (e.g., an M1 line), which is electrically connected to an inner source/drain region 210" of switch 200. Furthermore, output line 220O is used to take an output signal 106 from conductive line 214O (e.g., an M1 line), which is electrically connected to an outer source/drain region 210' of switch 200. In various embodiments, input and output lines 220 are disposed in higher metal layers than M1 to reduce electrical coupling with substrate 202. In some embodiments, input and output lines 220 are further positioned in non-adjacent metal layers to reduce coupling between input line 220I and output line 220O, particularly in areas where input line 220I and output line 220O intersect. For example, in FIGS. 2B and 2C, input line 220I is in conductive line layer M6 while output line 220O is in conductive line layer M4. At least one conductive line layer (M5) is disposed between input line 220I and output line 220. The specific metal layer configuration illustrated is but one example embodiment, and various conductive lines may be disposed in other configurations. For example, the output line 220O may be disposed in a higher conductive line layer than input line 220I in another embodiment.

Referring to FIG. 2B, various conductive interconnect features 218 (e.g., conductive vias and lines) are used to electrically connect input line 220I in a higher conductive line layer (e.g., M6) to conductive line 214I in layer M1. Referring to FIG. 2C, various conductive interconnect features 222 (e.g., conductive vias and lines) are used to electrically connect output line 220O in a higher conductive line layer (e.g., M4) to conductive line 214O in layer M1. In various embodiments, input/output lines and interconnect features 218/222 may be formed of similar materials using similar methods as grounded conductive wall 216 as described above. Isolation features are included to reduce electrical coupling between interconnect features 218 and 222. For example, a grounded conductive wall 216 may be disposed between interconnect features 218 and 222 as illustrated by FIG. 3. Grounded conductive wall 216 includes conductive lines in layers M1 through M5 and provides a wall of electrical isolation in layers having both interconnect features 218 and 222 (e.g., layers M1 through M4). Additional redistribution layers having conductive lines/vias (e.g., providing signals, power, and/or ground) may also be included in circuit 100. Other features such as contact pads, passivation layers, solder balls, and the like may also be formed over the redistribution layers as part of a device die containing circuit 100.

Thus, as described above, various features may be included in a switch for improved isolation. Such a switch may be used in an integrated circuit where such isolation is desirable in lieu of multi-switch isolation circuits, thus reducing power consumption of the device. For example, simulations were conducted using a switch having isolation features as described above in a circuit similar to circuit layout 100. A realistic load was placed at the output and each input was driven by a different frequency signal (e.g., a first frequency of 4 GHz and a second frequency of 4.2 GHz). One switch was disabled while the other was enabled. The switch and its load were laid out and extracted. At the output of the switches, the passed signal had a magnitude of 0.24 dB while the disabled signal had a magnitude of −78.5 dB, for a difference of 78.7 dB. An isolation target for these types of circuits is about 70 dB.

FIG. 4 illustrates a process flow 400 for configuring a switch according to various embodiments. In step 402, a switch (e.g., switch 200) is provided. The switch includes at least one gate (e.g., gate 212) with a first source/drain region (e.g., source/drain region 210") and a second source/drain region (e.g., source/drain region 210') formed on opposing sides of the gate. The source/drain regions may further be disposed at a top surface of a semiconductor substrate, for example, within an isolated dopant region (e.g., dopant region 206). In step 404, a conductive line (e.g., conductive line 214') is formed over the switch. The conductive line may be vertically aligned between the first and second source/drain regions. For example, at least a portion of the conductive line may by vertically aligned with the gate. In some embodiments, the conductive line is formed in layer M1 (e.g., a conductive line layer closest and immediately above the semiconductor substrate). In such embodiments, no other conductive lines are formed between the conductive line and the semiconductor substrate. In step 406, the conductive line is electrically connected to ground, for example by a grounded conductive wall (e.g., wall 216).

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A device comprising:
    a substrate comprising:
        a first well;
        a second well surrounding the first well;
    a switch supported by the first well of the substrate, the switch comprising:
        a gate configured to receive a control signal;
        a first source/drain; and
        a second source/drain;
    a metallization structure comprising:
        a first connection connected to the first source/drain, the first connection configured to receive an input signal;
        a second connection connected to the second source/drain, the second connection configured to provide an output signal when the switch is enabled and not to provide the output signal when the switch is disabled; and
        a third connection located between the first connection and the second connection, the third connection configured to be grounded.

2. The device according to claim 1, wherein the first connection, the second connection and the third connection each comprises a portion in a metallization level, and wherein a third portion of the third connection is located between a first portion of the first connection and a second portion of the second connection.

3. The device according to claim 2, wherein the metallization level is a M1 metallization level.

4. The device according to claim 2, wherein the first connection and the second connection each comprise a further portion, wherein a first further portion of the first connection is located in a first metallization level and a second further portion of the second connection is located in a second metallization level, and wherein at least one metallization level is located between the first metallization level and the second metallization level.

5. The device according to claim 4, wherein the at least one metallization level is exactly one metallization level.

6. The device according to claim 1, further comprising a first dopant region and a second dopant region located in the first well, wherein the first dopant region is located on a first side of the switch and the second dopant region is located on a second side of the switch, and wherein the first dopant region and the second dopant region are connected to the third connection.

7. The device according to claim 6, wherein the first dopant region and the second dopant region comprise dopants of a first type and the first source/drain and the second source/drain comprise dopants of a second opposite type.

8. The device of claim 1, further comprising a first dopant region adjacent to the first source/drain and a second dopant region adjacent to the second source/drain, and wherein the first and second dopant regions are electrically connected to ground.

9. The device of claim 1, wherein the first source/drain and the second source/drain comprise dopants of a first type, and wherein the first well comprises dopants of a second opposite type.

10. The device of claim 9, wherein second well is an isolation region comprises dopants of an opposite type as to the first well.

11. The device of claim 10, wherein the isolation region is configured to be electrically connected to a supply voltage.

12. A device comprising:
    a first gate supported by a semiconductor substrate, the first gate located between a shared source/drain and a first source/drain;
    a second gate supported by the semiconductor substrate, the second gate located between the shared source/drain and a second source/drain;
    a first conductive line located over and electrically connected to the first source/drain;
    a second conductive line located over and electrically connected to the second source/drain;
    a third conductive line located over and electrically connected to the shared source/drain;
    first interconnect features electrically connecting the first conductive line to a first output line disposed above the first conductive line;
    second interconnect features electrically connecting the second conductive line to a second output line disposed above the second conductive line;
    third interconnect features electrically connecting the third conductive line to an input line disposed above the third conductive line;
    a first ground conductive line disposed above the first source/drain and in between the first conductive line and the third conductive line; and
    a second ground conductive line disposed above the second source/drain and in between the second conductive line and the third conductive line,
    wherein the first and second ground conductive lines are configured to be connected to a ground potential.

13. The device according to claim 12, further comprising a ground conductive wall, wherein the first and second ground conductive lines are connected to the grounded conductive wall.

14. The device according to claim 13, further comprising a first dopant region adjacent to the first source/drain and a second dopant region adjacent to the second source/drain, wherein the first and second dopant regions are electrically connected to ground by the grounded conductive wall.

15. The device according to claim 12, wherein the first source/drain and the second source/drain are disposed within an isolated dopant region of the semiconductor substrate, wherein the isolated dopant region comprises dopants of an opposing type as the first source/drain and the second source/drain.

16. The device according to claim 15, further comprising an isolation region surrounding the isolated dopant region, wherein the isolation region comprises dopants of an opposing type as the isolated dopant region.

17. The device of claim 16, wherein the isolation region is configured to be electrically connected to a voltage potential different from ground potential.

18. The device according to claim 12, wherein the input line and the first and second output lines are disposed in different metallization layers, and wherein at least one other metallization layer is disposed between the different metallization layers.

19. The device according to claim 12, wherein a length of the shared source/drain is smaller than a length of the first source/drain and the second source/drain.

20. The device according to claim 12, wherein the first and second ground conductive lines are located on a left side of the first gate and on a right side of the second gate but not between the first and second gates.

* * * * *